US010578782B2

(12) United States Patent
Boyum et al.

(10) Patent No.: US 10,578,782 B2
(45) Date of Patent: Mar. 3, 2020

(54) COATED GLASS SURFACES AND METHOD FOR COATING A GLASS SUBSTRATE

(71) Applicant: APOGEE ENTERPRISES, INC., Minneapolis, MN (US)

(72) Inventors: Henry Boyum, Waseca, MN (US); Randy Leland Stull, Owatonna, MN (US)

(73) Assignee: APOGEE ENTERPRISES, INC., Minneapolis, MN (US)

(*) Notice: Subject to any disclaimer, the term of this patent is extended or adjusted under 35 U.S.C. 154(b) by 278 days.

(21) Appl. No.: 15/490,114

(22) Filed: Apr. 18, 2017

(65) Prior Publication Data

US 2017/0299786 A1 Oct. 19, 2017

Related U.S. Application Data

(60) Provisional application No. 62/324,660, filed on Apr. 19, 2016.

(51) Int. Cl.
| | |
|---|---|
| *B32B 15/04* | (2006.01) |
| *B32B 17/06* | (2006.01) |
| *G02B 5/08* | (2006.01) |
| *C03C 17/36* | (2006.01) |
| *C23C 14/08* | (2006.01) |

(Continued)

(52) U.S. Cl.
CPC .......... *G02B 5/0875* (2013.01); *B32B 17/061* (2013.01); *C03C 17/361* (2013.01); *C03C 17/366* (2013.01); *C03C 17/3644* (2013.01); *C03C 17/3681* (2013.01); *C23C 14/086* (2013.01); *C23C 14/185* (2013.01); *C23C 14/35* (2013.01); *E06B 3/6715* (2013.01); *G02B 5/208* (2013.01); *G02B 5/26* (2013.01); *B32B 2255/205* (2013.01); *B32B 2255/28* (2013.01); *B32B 2307/412* (2013.01);

(Continued)

(58) Field of Classification Search
USPC ................................ 428/426, 432, 434, 688
See application file for complete search history.

(56) References Cited

U.S. PATENT DOCUMENTS

| | | |
|---|---|---|
| 4,900,633 A | 2/1990 | Gillery |
| 4,902,081 A | 2/1990 | Huffer et al. |

(Continued)

FOREIGN PATENT DOCUMENTS

| | | |
|---|---|---|
| EP | 0622645 A1 | 11/1994 |
| EP | 0632507 A2 | 1/1995 |

(Continued)

OTHER PUBLICATIONS

International Search Report and Written Opinion of the International Searching Authority for International Patent Application No. PCT/US2017/028071, dated Oct. 10, 2017 (12 pages).

(Continued)

*Primary Examiner* — Lauren R Colgan
(74) *Attorney, Agent, or Firm* — Dorsey & Whitney LLP

(57) ABSTRACT

A coated substrate having a coating and a method of forming the same is disclosed, wherein the coating includes a plurality of discrete layers. The coating includes three reflective layers, an alloy layer disposed between two of the reflective layers, and two oxide layers and has a total thickness of 4000 Å or less.

15 Claims, 5 Drawing Sheets

(51) Int. Cl.

| | | |
|---|---|---|
| *C23C 14/18* | (2006.01) | |
| *C23C 14/35* | (2006.01) | |
| *E06B 3/67* | (2006.01) | |
| *G02B 5/20* | (2006.01) | |
| *G02B 5/26* | (2006.01) | |

(52) U.S. Cl.
CPC ..... *B32B 2307/416* (2013.01); *B32B 2419/00* (2013.01); *C03C 2217/256* (2013.01); *C03C 2218/156* (2013.01)

(56) References Cited

U.S. PATENT DOCUMENTS

| | | | |
|---|---|---|---|
| 5,038,356 | A | 8/1991 | Botez et al. |
| 5,298,048 | A | 3/1994 | Lingle et al. |
| 5,318,685 | A | 6/1994 | Oshaughnessy |
| 5,332,618 | A | 7/1994 | Austin |
| 5,563,734 | A | 10/1996 | Wolfe et al. |
| 5,643,349 | A | 7/1997 | Piper et al. |
| 5,728,456 | A | 3/1998 | Adair et al. |
| 5,834,103 | A | 11/1998 | Bond et al. |
| 6,060,178 | A | 5/2000 | Krisko |
| 6,231,999 | B1 | 5/2001 | Krisko |
| 6,316,111 | B1 | 11/2001 | Krisko |
| 6,587,288 | B2 | 7/2003 | Erz et al. |
| 6,652,974 | B1 | 11/2003 | Krisko |
| 6,660,365 | B1 | 12/2003 | Krisko et al. |
| 6,802,943 | B2 | 10/2004 | Stachowiak |
| 6,838,159 | B2 | 1/2005 | Eby et al. |
| 6,919,133 | B2 | 7/2005 | Hartig et al. |
| 6,964,731 | B1 | 11/2005 | Krisko et al. |
| 6,974,629 | B1 | 12/2005 | Krisko et al. |
| 7,037,589 | B2 | 5/2006 | Hartig et al. |
| 7,063,893 | B2 | 6/2006 | Hoffman |
| 7,067,195 | B2 | 6/2006 | Hoffman et al. |
| 7,122,252 | B2 | 10/2006 | Hoffman |
| 7,138,182 | B2 | 11/2006 | Krisko et al. |
| 7,157,123 | B2 | 1/2007 | Hartig |
| 7,241,506 | B2 | 7/2007 | Hartig |
| 7,309,527 | B2 | 12/2007 | Oshaughnessy et al. |
| 7,339,728 | B2 | 3/2008 | Hartig |
| 7,419,729 | B2 | 9/2008 | Ewasko et al. |
| 8,062,700 | B2 | 11/2011 | Nun et al. |
| 8,574,718 | B2 | 11/2013 | Stull |
| 8,895,150 | B1 | 11/2014 | Stull |
| 9,096,041 | B2 | 8/2015 | Nun et al. |
| 2004/0258947 | A1 | 12/2004 | Moelle et al. |
| 2005/0025982 | A1 | 2/2005 | Krisko et al. |
| 2006/0121315 | A1 | 6/2006 | Myli et al. |
| 2007/0009745 | A1 | 1/2007 | Hoffman |
| 2007/0009747 | A1 | 1/2007 | Medwick et al. |
| 2007/0102291 | A1 | 5/2007 | Hartig |
| 2007/0193876 | A1 | 8/2007 | Chu et al. |
| 2007/0248756 | A1 | 10/2007 | Krisko et al. |
| 2007/0281171 | A1 | 12/2007 | Coster et al. |
| 2008/0311389 | A1 | 12/2008 | Roquiny et al. |
| 2009/0130409 | A1 | 5/2009 | Reutler et al. |
| 2009/0176086 | A1 | 7/2009 | Martin et al. |
| 2009/0233037 | A1 | 9/2009 | Medwick et al. |
| 2009/0233071 | A1 | 9/2009 | Medwick et al. |
| 2010/0035036 | A1 | 2/2010 | McCloy et al. |
| 2010/0062245 | A1 | 3/2010 | Martin et al. |
| 2010/0221575 | A1* | 9/2010 | Stull ............... C03C 17/002 428/680 |
| 2011/0085233 | A1 | 4/2011 | Furusato |
| 2011/0236715 | A1 | 9/2011 | Polcyn et al. |
| 2012/0219821 | A1* | 8/2012 | Frank ............... C03C 17/36 428/630 |
| 2015/0015940 | A1 | 1/2015 | Nakajima |
| 2015/0020745 | A1 | 1/2015 | Imamura et al. |
| 2015/0043606 | A1 | 2/2015 | Hamaguchi et al. |
| 2015/0345005 | A1 | 12/2015 | Ding et al. |
| 2016/0223729 | A1 | 8/2016 | Medwick et al. |
| 2017/0090078 | A1 | 3/2017 | Decoux |
| 2018/0319703 | A1 | 11/2018 | Boyum et al. |

FOREIGN PATENT DOCUMENTS

| | | |
|---|---|---|
| EP | 1071832 B1 | 9/2002 |
| EP | 1842835 A2 | 10/2007 |
| WO | 0138249 A1 | 5/2001 |
| WO | 0218132 A2 | 3/2002 |
| WO | 2006122900 A1 | 11/2006 |
| WO | 2009114493 A1 | 9/2009 |
| WO | 2010053921 A1 | 5/2010 |
| WO | 2012118469 A1 | 9/2012 |
| WO | 2014164695 A1 | 10/2014 |
| WO | 2015093322 A1 | 6/2015 |
| WO | 2017058887 A1 | 4/2017 |
| WO | 2017184568 A1 | 10/2017 |

OTHER PUBLICATIONS

First Office Action for Brazilian Patent Application No. PI 0921674-0, dated Sep. 24, 2018, with English translation (6 pages).

International Search Report and Written Opinion of the International Searching Authority for International Patent Application No. PCT/US2018/022449, dated Jun. 14, 2018 (14 pages).

International Search Report for International Patent Application No. PCT/US2016/054134, dated Nov. 30, 2016 (7 pages).

Lobmann et al., "Industrial Processing of TiO2 thin Films from Soluble Precursor Powders," Glass Sci. Technology, 2003, pp. 1-7, vol. 76, No. 1.

Office Action for European Patent Application No. 09748654.2, dated Feb. 19, 2018 (7 pages).

Written Opinion of the International Searching Authority for International Patent Application No. PCT/US2016/054134, dated Nov. 30, 2016 (8 pages).

Medwick, Paul A., "U.S. Appl. No. 61/035,587—Solar Mirror", filed Mar. 11, 2008, 28 pages.

National Institute of IP, "Chilean Examination and Search Report", Application No. 1000-2011, dated Feb. 18, 2014, 10 pages.

PCT, "International Preliminary Report on Patentability", Application No. PCT/US2009/063149, dated May 10, 2011, 11 page.

PCT, "International Search Report and Written Opinion", Application No. PCT/US2009/063149, dated Feb. 9, 2010, 17 pages.

Special Metals Corporation, "Inconel alloy 600 product literature", http://www.specialmetals.com; Accessed Jun. 26, 2014, Sep. 2008, 16 pages.

Office Action and Search Report issued for Chilean Patent Application No. 201802957 dated Oct. 14, 2019, 33 pages (with English translation).

* cited by examiner

COATED GLASS SURFACES AND METHOD FOR COATING A GLASS SUBSTRATE

CROSS-REFERENCE TO RELATED APPLICATION

This application claims benefit under 35 U.S.C. § 119 of the earlier filing date of U.S. Provisional Application No. 62/324,660, filed Apr. 19, 2016, entitled "COATED GLASS SURFACES AND METHOD FOR COATING A GLASS SUBSTRATE," which is hereby incorporated by reference in its entirety as if fully set forth herein.

FIELD OF THE INVENTION

The present invention relates to coatings for substrates or substrate surfaces.

BACKGROUND

Advances in window technology have reduced energy consumption by affecting and improving heating, cooling and lighting. Various types of glass coatings have been developed for these purposes. Examples of glass coatings for reduced energy consumption include solar control coatings that reduce glare or overheating from the sun, and low-emissivity ("low-E") coatings which reduce radiative heat losses often accounting for significant heat transfer through a window.

Low-E coatings are well known in the art. The coatings generally have a high reflectance in the thermal infrared (IR) and a high transmittance in the visible spectrum. Thus, they are low-emissive of thermal infrared. Some such coatings may admit solar near IR (NIR) to help heat a building, such as in a cold climate. Some such coatings may reflect the NIR back, such as in a warm climate. The low-emissivity optical properties are generally obtained by application of a material with certain intrinsic properties or alternatively, multiple materials may be combined to achieve the particular desired performance. One class of materials suitable for use in providing low-emissivity includes very thin films of metals. Thin films forming infrared-reflection film are generally a conductive metal such as silver, gold or copper.

Coatings including such metals can be made highly transparent to visible radiation or light, while remaining reflective in the infrared spectrum. Such infrared-reflective coatings often include one or two layers of infrared-reflection materials and two or more layers of transparent dielectric materials. The infrared-reflection materials reduce the transmission of heat through the coating. The dielectric materials allow transmission of IR and visible light and control other properties and characteristics of the coating, such as color and durability.

In order to obtain improved performance, some current systems and devices employ triple reflective metal coatings or use a barrier as an absorbing layer. By increasing the number of reflective metal layers or coatings, the infrared reflection can be increased. The industry has adopted triple silver coatings as optimal for this purpose. However, it is known that triple silver coatings suffer from color inconsistency when viewed perpendicular to the glass surface vs. at acute angles. That is, the color coordinate values of triple silver coated articles viewed from a direction that is substantially normal to the coated major surface (defined as a base view point or 0°) may be substantially different from the color coordinate values from directions that are acute to the coated major surface, such as at angles of about 10° to 89°. The shift in color coordinate values is manifested as a characteristic green or blue appearance when the coated article is viewed at an acute angle to a coated surface, for example at an angle 10° to 89° from normal to the plane of the coated surface. As the angle increases from normal, the color coordinate shift increases.

Accordingly, there is a need in the industry for a coating for a light transmissive substrate that provides improved performance and color control over currently available coatings and coated substrates while providing the infrared reflective benefits of triple metal coatings such as triple silver coatings.

SUMMARY OF THE INVENTION

Disclosed herein is a substrate comprising first and second major surfaces and a coating applied to at least one of the major surfaces. The coating comprises a plurality of layers. In embodiments, the coating comprises at least seven (7) layers and as many as twenty (20) layers, wherein three of the layers are reflective layers, and one layer is an alloy layer, wherein the alloy layer is disposed between two of the three reflective layers.

A method of coating a substrate is provided. The method includes applying at least seven discrete layers on a glass surface by sputtering, wherein at least three of the layers are reflective layers and at least one of the layers comprises an alloy, wherein the alloy layer is applied between two of the reflective layers.

An example embodiment of coated substrate is disclosed. The coated substrate includes a light transmissive substrate having one or more major surfaces. The coated substrate includes a coating disposed on at least a portion of one major surface of the substrate. The coating of the coated substrate includes a plurality of discrete layers. The plurality of discrete layers of the coating includes a first reflective layer, a second reflective layer disposed above first reflective layer, a third reflective layer disposed above second reflective layer, a first oxide layer disposed between first and second reflective layers, a second oxide layer disposed between second and third reflective layers, a third oxide layer disposed between the substrate and the first reflective layer, and an alloy layer disposed between first and second reflective layers and contiguous to the second reflective layer. The coating of the coated substrate has a thickness of about 1000 Å to 4000 Å.

An example embodiment of an insulated glass unit is disclosed. The insulated class unit includes at least two light transmissive substrates each having one or more major surfaces. The insulating glass unit includes a substrate mounting unit containing the at least two substrates, wherein the substrate mounting unit holds the at least two substrates in a substantially parallel configuration, and the substrate mounting unit and at least two substrates collectively form an enclosed space. The insulated glass unit includes a coating disposed on at least a portion of at least one of the major surfaces, the coating comprising a plurality of discrete layers. The plurality of discrete layers of the coating of the insulating glass unit includes a first reflective layer, a second reflective layer disposed above first reflective layer, a third reflective layer disposed above second reflective layer, a first oxide layer disposed between first and second reflective layers, a second oxide layer disposed between second and third reflective layers, a third oxide layer disposed between the substrate and the first reflective layer, and an alloy layer disposed between first and second reflective layers and contiguous to the second reflective layer. The coating of the insulating glass unit has a thickness of about 1000 Å to 4000 Å.

An example method of coating a light transmissive substrate is disclosed. The method includes sputtering onto at least a portion of a major surface of the substrate, in order: a first reflective layer; a first oxide layer; an alloy layer; a second reflective layer; a second oxide layer; and a third reflective layer; wherein a total thickness of the coating is about 1000 Å to 4000 Å.

Other advantages and features may become apparent from the following description, drawings, and claims.

DETAILED DESCRIPTION OF THE INVENTION

Definitions

Figure 1:
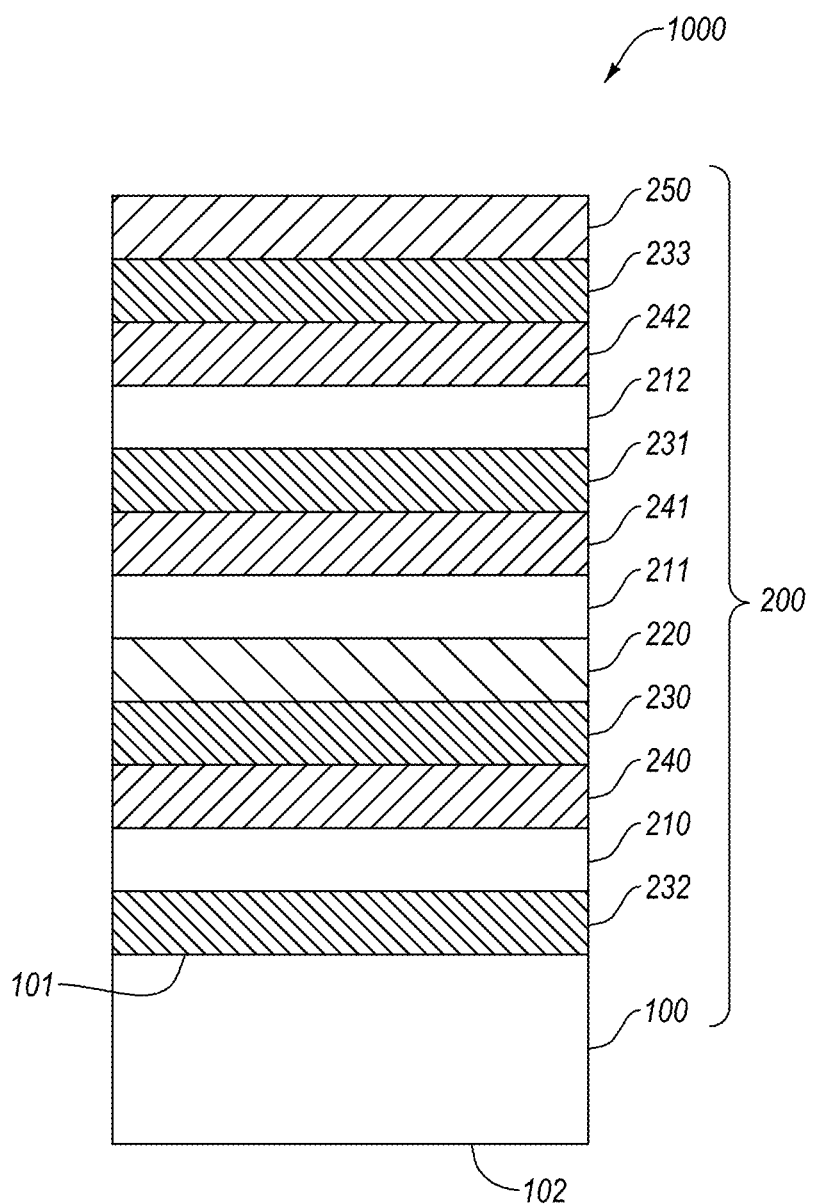
FIG. 1 is a schematic illustration of a coated substrate, according to an embodiment.

Unless otherwise defined, all technical and scientific terms used herein have the same meaning as commonly understood by one of ordinary skill in the art. In case of conflict, the present document, including definitions, will control.

The terms "comprise(s)," "include(s)," "having," "has," "can," "contain(s)," and variants thereof, as used herein, are intended to be open-ended transitional phrases, terms, or words that do not preclude the possibility of additional acts or structures. The singular forms "a," "and" and "the" include plural references unless the context clearly dictates otherwise. The present disclosure also contemplates other embodiments "comprising," "consisting of" and "consisting essentially of," the embodiments or elements presented herein, whether explicitly set forth or not.

As used herein, the term "optional" or "optionally" means that the subsequently described event or circumstance may but need not occur, and that the description includes instances where the event or circumstance occurs and instances in which it does not.

As used herein, the term "about" modifying, for example, the quantity of an ingredient in a composition, concentration, volume, process temperature, process time, yield, flow rate, pressure, and like values, and ranges thereof, employed in describing the embodiments of the disclosure, refers to variation in the numerical quantity that can occur, for example, through typical measuring and handling procedures used for making compounds, compositions, concentrates or use formulations; through inadvertent error in these procedures; through differences in the manufacture, source, or purity of starting materials or ingredients used to carry out the methods, and like proximate considerations. The term "about" also encompasses amounts that differ due to aging of a formulation with a particular initial concentration or mixture, and amounts that differ due to mixing or processing a formulation with a particular initial concentration or mixture. Where modified by the term "about" the claims appended hereto include equivalents to these quantities. Further, where "about" is employed to describe a range of values, for example "about 1 to 5" the recitation means "about 1 to about 5" and "1 to about 5" and "about 1 to 5" unless specifically limited by context.

As used herein, the word "substantially" modifying, for example, the type or quantity of an ingredient in a composition, a property, a measurable quantity, a method, a position, a value, or a range, employed in describing the embodiments of the disclosure, refers to a variation that does not affect the overall recited composition, property, quantity, method, position, value, or range thereof in a manner that negates an intended composition, property, quantity, method, position, value, or range. Examples of intended properties include, solely by way of nonlimiting examples thereof, flexibility, partition coefficient, rate, solubility, temperature, and the like; intended values include thickness, yield, weight, concentration, and the like. The effect on methods that are modified by "substantially" include the effects caused by variations in type or amount of materials used in a process, variability in machine settings, the effects of ambient conditions on a process, and the like wherein the manner or degree of the effect does not negate one or more intended properties or results; and like proximate considerations. Where modified by the term "substantially" the claims appended hereto include equivalents to these types and amounts of materials.

As used herein, the term "substrate" means a solid article comprising a first major surface and a second major surface defining a substrate thickness, wherein the article transmits visible light through the thickness thereof. In embodiments, the substrate can be substantially planar, substantially curved (e.g., domed, radiused, etc.), substantially angular (e.g., having a plurality of sub-surfaces meeting at angles therebetween), or combinations of any the foregoing.

As used herein, the term "coating" refers to a plurality of layers disposed on a substrate. The coating substantially covers an entire major surface of a substrate or a portion thereof.

As used herein, the term "layer" refers to a composition disposed onto a surface at a selected thickness.

As used herein, the term "discrete" referring to a layer of the invention means that the layer does not substantially contact another layer of the same composition.

As used herein, the term "contiguous" referring to a layer of the invention means that the layer is proximal to and in substantial contact with another layer of the same or of different composition.

As used herein, "bottom"/"top"; "lower"/"upper"; "lowest"/ "highest"; or other such terms referring to the relative position of a layer or a coating of the invention refer to the orientation of the layer or coating relative to a substrate major surface. The layer or coating physically contacting a substrate major surface may be referred to as the "lowest" or "bottom" layer or coating or another such term. The layer or coating furthest away from the substrate surface may be referred to as the "top" or "uppermost" layer or coating, or another such term.

As used herein, the term "alloy" means an alloy or superalloy comprising nickel. In embodiments the alloy or superalloy further comprises chromium. In embodiments the alloy or superalloy further comprises molybdenum.

Discussion

Disclosed herein is a coated substrate. More particularly, disclosed herein is a light transmissive substrate having a coating deposited thereon, the coating comprising at least six and as many as twenty discrete layers.

The substrate may comprise, consist essentially of, or consist of a light transmissive material such as glass, quartz, or any plastic or organic polymeric substrate. Suitable light transmissive plastic or organic polymeric substrates include polyesters such as polyethylene terephthalate, polyacrylates such as polymethyl methacrylate, and polycarbonates such as bisphenol-A based carbonates (e.g. LEXAN®, sold by Saudi Basic Industries Corp. of Riyadh, Saudi Arabia) or any other suitable material or combination of materials and various laminates thereof as will be understood by those of skill. In embodiments, the substrate is substantially planar and comprises a first major surface and a second major surface defining a substrate thickness. In embodiments, the substrate may be non-planar as disclosed above. The substrate thickness is not particularly limited, but in embodiments is about 25 microns to 2 cm thick. Width and length of the substrate is not limited and is selected by the user based on considerations such as equipment limitations or commercial value. In embodiments the light transmissive material is transparent or substantially transparent to visible light. In some embodiments the substrate is a laminate of two or more different transparent, substantially transparent, or light transmissive materials. In some embodiments, the substrate may include a clear window glass, also known as a soda glass. In some embodiments, the substrate may have inherent low-emissive properties, apart from a film or coating on the surface thereof, such as, for example, as can be accomplished by controlling the iron content in a glass substrate. In some embodiments, the substrate may be float glass. In some embodiments, the substrate may be a type of glass having low-emissive properties, such as, but not limited to a borosilicate or PYREX™.

The substrate includes a coating disposed on at least the first major side thereof. The coating may comprise, consist essentially of, or consist of 7 to 20 discrete layers. The layers may be arranged in a "stack" on one or more major substrate surfaces. A single coating stack applied to the first major side of a suitable substrate is generally referred to herein; but it will be understood that such references shall include such coatings applied in various configurations. Thus, for example, gradient coatings, substrates having both first and second coatings, segmented coatings or patterned coatings covering only a portion of one major surface of a substrate, combinations thereof, and other related embodiments are envisioned in combination with the coating compositions as described herein. Additionally, in embodiments, a substrate may include a first coating disposed on the first major side thereof and a second coating disposed on the second major side thereof. In some embodiments, the first and second coatings may be the same; in other embodiments, the first and second coatings are different. Where the first and second coatings are different, the coatings may differ in one or more of overall coating thickness, layer thickness of one or more layers, layer composition of one or more layers, total number of layers, and layer order as applied in a stack of layers that makes up the coating. In some embodiments, a substrate first major surface may include any of the coatings disclosed herein while the substrate second major surface includes a different surface treatment. Such different surface treatments are not particularly limited and may include coating stacks of a different composition and intended to impart a different set of properties from the coating stacks described herein; protective coatings such as polymer coatings, sol-gel coatings, and the like; tinted or dyed coatings; adhesive coatings; and other coatings for various purposes as will be appreciated by one of skill.

The coatings disclosed herein may comprise, consist essentially of, or consist of 7 to 20 discrete layers, or 7 to 19 layers, or 7 to 18 layers, or 7 to 17 layers, or 7 to 16 layers, or 7 to 15 layers, or 7 to 14 layers, or 7 to 13 layers, or 7 to 12 layers, or 7 to 11 layers, or 7 to 10 layers, or 8 to 20 layers, or 9 to 20 layers, or 10 to 20 layers, or 11 to 20 layers, or 12 to 20 layers, or 13 to 20 layers, or 14 to 20 layers, or 15 to 20 layers, or 16 to 20 layers, or 17 to 20 layers, or 18 to 20 layers, or 19 to 20 layers, or 7 layers, or 8 layers, or 9 layers, or 10 layers, or 11 layers, or 12 layers, or 13 layers, or 14 layers, or 15 layers, or 16 layers, or 17 layers, or 18 layers, or 19 layers, or 20 layers. The total coating thickness may range from about 1000 Å to 4000 Å, for example about 1200 Å to 4000 Å, or about 1400 Å to 4000 Å, or about 1600 Å to 4000 Å, or about 1800 Å to 4000 Å, or about 2000 Å to 4000 Å, or about 2200 Å to 4000 Å, or about 2400 Å to 4000 Å, or about 2600 Å to 4000 Å, or about 1000 Å to 3500 Å, or about 1000 Å to 3000 Å, or about 1000 Å to 2900 Å, or about 1000 Å to 2800 Å, or about 1000 Å to 2700 Å, or about 1000 Å to 2600 Å, or about 1500 Å to 3000 Å, or about 1800 Å to 2800 Å, or about 2000 Å to 2800 Å, or about 2000 Å to 3000 Å, or about 2500 Å to 3500 Å.

In embodiments, three of the 7 to 20 layers of the coating may be reflective layers. The reflective layers each reflect a portion of incident infrared and/or near-infrared (NIR) radiation that may impinge on the coating surface. Suitable reflective layers may consist essentially of or consist of silver, gold, copper, alloys including any of the foregoing (e.g., mixtures of silver with copper, gold, platinum and/or palladium), or mixtures of any of the foregoing. In some embodiments, one or more of the reflective layers may consist essentially of or consist of silver. In some embodiments, all three of the reflective layers may consist essentially of silver or consist of silver.

In embodiments, a first reflective layer may be disposed on the bottom or proximal to the bottom of the stack of layers that make up the coating. That is, of the three reflective layers, the first reflective layer is closest to the substrate surface. A second reflective layer may be disposed on top of the first reflective layer, and a third reflective layer may be disposed on top of the second reflective layer. One or more (e.g., each) of the discrete reflective layers may have a thickness ranging from about 10 Å (1 nm) to 200 Å (20 nm), such as about 20 Å to 200 Å, or about 30 Å to 200 Å, or about 40 Å to 200 Å, or about 50 Å to 200 Å, or about 60 Å to 200 Å, or about 70 Å to 200 Å, or about 80 Å to 200 Å, or about 10 Å to 190 Å, or about 10 Å to 180 Å, or about 10 Å to 170 Å, or about 10 Å to 160 Å, or about 10 Å to 150 Å, or about 10 Å to 140 Å, or about 10 Å to 130 Å, or about 10 Å to 120 Å, or about 50 Å to 150 Å, or about 70 Å to 140 Å, or about 70 Å to 130 Å. The thickness of each of the first, second, and third reflective layers may be the same or different, as selected by the user. In embodiments, the thickness of the third reflective layer may be greater than the thickness of the second reflective layer. In embodiments, the thickness of the second reflective layer may be greater than the thickness of the first reflective layer. In some embodiments, the first reflective layer may be about 10 Å to 200 Å thick, or about 50 Å to 100 Å thick, or about 70 Å to 80 Å thick. In some embodiments, the second reflective layer may be about 10 Å to 200 Å thick, or about 70 Å to 150 Å thick, or about 100 Å to 120 Å thick. In some embodiments, the third reflective layer may be about 10 Å to 200 Å thick, or about 100 Å to 170 Å thick, or about 130 Å to 150 Å thick.

In embodiments, one of the layers of the coating may be an alloy layer. In embodiments, the alloy layer may consist essentially of a nickel-based alloy or superalloy, or an austenitic nickel-based alloy or superalloy. In embodiments, the alloy is a nickel/chromium/molybdenum (hereinafter "NCM") alloy, for example INCONEL™, such as INCONEL™ 625. INCONEL™ 625 is an NCM alloy composed of Ni (about 58% minimum), Cr (about 20 to about 23%), Mo (about 8 to about 10%), Nb+Ta (about 3.15 to about 4.15%) and Fe (about 5% maximum) by weight. Typical Properties of INCONEL™ 625 include a density of 8.44 g/cm$^3$, a melting point of about 1350° C., a co-efficient of expansion of 12.8 μm/m° C. (20-100° C.), a modulus of rigidity of 79 kN/mm$^2$, and a modulus of elasticity of 205.8 kN/mm$^2$. INCONEL™ 625 is covered by the following standards: BS 3076 NA 21, ASTM B446 and AMS 5666. INCONEL™ 625 is available from, and is the tradename of Special Metals Corporation of Huntington, W.Va. For purposes of the examples provided herein, INCONEL™ may be obtained for use in any suitable form. INCONEL™ is available in several different alloys, although alternative forms will not depart from the overall scope of the present invention. INCONEL™ 625 is equivalent to: W.NR 2.4856 (Multi-Alloys cc, South Africa), UNS N06625 (Sandmeyer Steel Co., Philadelphia, Pa.) and is also known as AWS 012 as well as under common trade names of CHRONIN® 625, ALTEMP® 625, HAYNES® 625, NICKELVAC® 625 and NICROFER® 6020.

While NCM alloys are specifically described, other alloys or superalloys suitable for use in high temperature applications which may have one or more of oxidation and corrosion resistant properties or are otherwise suited for extreme environments or have excellent mechanical strength and creep resistance at high temperature, and/or good surface stability may be acceptable for use in conjunction with the coatings of the invention.

The alloy layer may be about 5 Å to 100 Å thick, for example about 5 Å to 90 Å, or about 5 Å to 80 Å, or about 5 Å to 70 Å, or about 5 Å to 60 Å, or about 5 Å to 50 Å, or about 5 Å to 40 Å, or about 5 Å to 30 Å, or about 5 Å to 25 Å, or about 5 Å to 20 Å, or about 5 Å to 15 Å, or about 6 Å to 50 Å, or about 7 Å to 50 Å, or about 8 Å to 50 Å, or about 9 Å to 50 Å, or about 10 Å to 50 Å, or about 10 Å to 40 Å, or about 10 Å to 30 Å, or about 10 Å to 20 Å thick. In embodiments, the alloy layer may be disposed between first and second reflective layers. In embodiments, the alloy layer may be contiguous to a reflective layer. In embodiments, the alloy layer may be contiguous to the second reflective layer. In embodiments, the alloy layer may be disposed below and contiguous to a reflective layer. In embodiments, the alloy layer is disposed below and contiguous to the second reflective layer.

The remainder of the layers of the coating are selected from oxide layers, optional barrier layers, and an optional functional top layer. At least three (3) layers may be oxide layers. Oxide layers may comprise one or more metal oxides. Barrier layers may comprise one or more metals. Functional top layers may be disposed as the top layer in the stack in order to impart properties such as antireflective properties, NIR reflective properties, abrasion resistance, scratch resistance, heat resistance, UV resistance, fingerprint resistance, and the like, or combinations of any of the foregoing. In embodiments, the functional top layer may comprise one or more metals, metal oxides, or a mixture thereof.

Oxide layers may comprise, consist essentially of, or consist of one or more metal oxides. The oxide layers are substantially transparent dielectric layers. Useful oxide layers may include oxides of zinc, tin, indium, bismuth, titanium, hafnium, zirconium, and alloys thereof. While oxides are specifically referenced herein, alternative dielectric materials may be suitable for purposes of the present invention. Thus, for example, in some embodiments an oxide layer may comprise silicon nitride and/or silicon oxynitride. In some embodiments, the dielectric layers or oxide layers are formed of zinc oxide (ZnO), tin oxide (SnO$_2$) or mixtures thereof. In such embodiments, an oxide layer or transparent dielectric layer may include a zinc tin oxide mixture. In various embodiments, a dielectric layer may be a single discrete layer consisting essentially of a single dielectric material, a single layer comprising a blend of two or more materials, or two or more contiguous layers comprising or consisting essentially of the same or different dielectric materials. It should be understood that throughout the specification reference is made to metal oxides. This should not be considered limited to fully oxidized metal oxides but also those species that can form an agglomeration and have partial oxidation states. They can be designated as a M(metal)ox(oxide), e.g., TiO$_x$, SnO$_x$, etc. For example, one or more oxide layers may comprise, consist essentially of, or consist of ZnO, or SnO$_2$, SnO$_x$, or a combination thereof.

In embodiments, three or more layers of the coating stack may be oxide layers. In such embodiments, a first oxide layer may be disposed between the first and second reflective layers, a second oxide layer may be disposed between the second and third reflective layers, and a third oxide layer may be disposed between the substrate surface and the first reflective layer. In some embodiments, the third oxide layer may be contiguous to the coated surface, e.g. a first major substrate surface. One or more additional oxide layers may be optionally employed in the coating stack. Fourth, fifth, sixth, or more oxide layers may be optionally disposed in the stack as selected by the user where such layers are numbered merely for convenience of recitation and without regard to recited order or presence or absence of any other numbered layer. In general, the layer configuration of fourth or higher oxide layers may be selected for advantageous use of the dielectric properties of the selected oxide layer in conjunction with the layer stack arrangement.

The thickness of each of the oxide layers may be about 100 Å to 1000 Å, or about 100 Å to 900 Å. In embodiments, the thickness of the first oxide layer may be about 500 Å to 1000 Å, or about 600 Å to 900 Å, or about 700 Å to 800 Å. In embodiments, the thickness of the second oxide layer may be about 400 Å to 800 Å, or about 500 Å to 700 Å. In embodiments, the thickness of the third oxide layer may be about 100 Å to 400 Å, or about 200 Å to 300 Å. In embodiments, the thickness of the fourth oxide layer may be about 100 Å to 300 Å, or about 100 Å to 200 Å.

In embodiments, one or more barrier layers (e.g., 1-10 barrier layers) may be optionally included in the coating. Barrier layers may comprise, consist essentially of, or consist of a metal. In embodiments, one or more barrier layers consists essentially of titanium metal. In embodiments, the metal consists essentially of a M(metal)Ox(oxide), e.g., TiOx, SnOx, etc. In embodiments, one or more barrier layers may be disposed contiguous to and on top of a reflective layer. In such embodiments, the barrier layer may act as a sacrificial oxidizing material, thereby providing an oxidative barrier to the reflective layer beneath it. In some embodiments, a barrier layer may be disposed contiguous to and on top of each of the reflective layers in the coating stack.

In embodiments, a functional top layer may be optionally included in the coating. The functional top layer may be disposed as the top layer in the stack (e.g., the layer farthest from the substrate) in order to impart properties such as antireflective properties, NIR reflective properties, abrasion resistance, scratch resistance, heat resistance, UV resistance, fingerprint resistance, and the like as well as two or more of these. In some embodiments, the functional top layer may comprise one or more metals, metal oxides, or mixtures thereof. In some such embodiments, the top layer may comprise or consist essentially of titanium, titanium oxide, or a mixture thereof ($TiO_x$, or "Tiox"). In some embodiments, the top layer may comprise or consist essentially of silicon nitride ($Si_3N_4$). Where employed in the coatings disclosed herein, the top layer may be about 50 Å to 300 Å thick, or about 70 Å to 300 Å thick, or about 90 Å to 300 Å thick, or about 110 Å to 300 Å thick, or about 130 Å to 300 Å thick, or about 100 Å to 250 Å thick, or about 100 Å to 200 Å thick, or about 100 Å to 190 Å thick, or about 100 Å to 180 Å thick, or about 100 Å to 170 Å thick, or about 100 Å to 160 Å thick, or about 100 Å to 150 Å thick, or about 110 Å to 200 Å thick, or about 110 Å to 170 Å thick, or about 120 Å to 170 Å thick. Where employed, the top layer may comprise a surface which is exposed to, faces, or provides an interface with the environment in which the coated substrate is placed.

Referring now to FIG. 1, an exemplary embodiment of a coated substrate of the invention is shown schematically. Coated substrate 1000 includes a substrate 100 having first major side 101 and second major side 102. First major side 101 includes a coating 200 disposed thereon. Coating 200 includes twelve discrete layers. The coating 200 may have a total thickness of less than 4000 Å, such as between 2000 Å and 3000 Å. Coating 200 is transparent or substantially transparent to visible light. The coating 200 reflects a portion of radiant infrared energy, thus tending to keep radiant heat on the same side of the substrate from which it originated.

Coating 200 comprises a plurality of layers. The coating is arranged in a layer system, or stack, as schematically shown in FIG. 1. The coating or stack 200 may be deposited on and/or attached to the substrate 100. The thickness of one or more layers making up coating 200 may be continuous, may be uniform, or may vary. The thickness of an individual layer may vary across one or more of its width or length. In one example, the film region or a portion thereof may have or include a gradual change or graded thickness across at least a portion thereof. For example, one or more layers may, in some instances, increase in thickness or decrease in thickness in one or more regions of the coated surface. The thickness of an individual layer may vary between any of the specific layer thicknesses disclosed herein, such as between any of the endpoints of ranges of corresponding layer thicknesses disclosed herein. The one or more layers may be provided in a contiguous relationship, that is, arranged directly on top of and substantially contacting an adjacent layer or a substrate major surface.

Coating 200 may include three reflective layers 210, 211, 212. First reflective layer 210 may be proximal to but not contiguous to the substrate first major surface 101 and may be the bottom reflective layer. Third reflective layer 212 may be disposed near the top of the stack and may be the topmost of the three reflective layers. Second reflective layer 211 may be disposed between first reflective layer 210 and third reflective layer 212. Each of the first, second, and third reflective layers may be discrete layers. For example, the three reflective layers may not substantially contact one another. In such embodiments, first reflective layer 210 may be about 50 Å to 100 Å thick, second reflective layer 211 may be about 90 Å to 130 Å thick, and third reflective layer 212 may be about 100 Å to 150 Å thick. In embodiments, one or more of the reflective layers may consist essentially of silver.

Coating 200 may further include an alloy layer 220. Alloy layer 220 may be disposed between first and second reflective layers 210, 211 and may be contiguous to second reflective layer 211. In such embodiments, alloy layer 220 may be about 10 Å to 30 Å thick. In embodiments, alloy layer 220 may comprise or consist essentially of a nickel alloy such as an NCM alloy.

Coating 200 may further include at least four oxide layers 230, 231, 232, 233. First oxide layer 230 may be disposed between first reflective layer 210 and second reflective layer 211. Second oxide layer 231 may be disposed between second reflective layer 211 and third reflective layer 212. Third oxide layer 232 may be disposed contiguous to the substrate first major surface 101 and beneath first reflective layer 210. Fourth oxide layer 233 may be disposed over the third reflective layer 212. In such embodiments, first oxide layer 230 may be about 750 Å to 850 Å thick, second oxide layer 231 may be about 550 Å to 650 Å thick, third oxide layer 232 may be about 150 Å to 300 Å thick, and fourth oxide layer 233 may be about 125 Å to 175 Å thick. In embodiments, one or more of the oxide layers may comprise or consist essentially of tin oxide ($SnO_2$). In embodiments, one or more of the oxide layers may comprise or consist essentially of zinc oxide (ZnO). In embodiments, one or more of the oxide layers may comprise a mixture of $SnO_2$ and ZnO.

Coating 200 may further includes at least three barrier layers 240, 241, 242. First barrier layer 240 may be disposed on top of and contiguous to first reflective layer 210. Second barrier layer 241 may be disposed on top of and contiguous to second reflective layer 211. Third barrier layer 242 may be disposed on top of and contiguous to third reflective layer 212. In such embodiments, first, second, and third barrier layers 240, 241, 242 may each be about 10 Å to 30 Å thick. In embodiments, one or more of first, second, and third barrier layers 240, 241, 242 may comprise or consist essentially of titanium.

Coating 200 may further include functional top layer 250. Functional top layer 250 may be disposed on top of fourth oxide layer 233 and may be the top layer of the stack of layers making up coating 200 (e.g., distal most layer from the substrate). In such embodiments, top layer 250 may be about 120 Å to 150 Å thick. In embodiments, the top layer 250 may comprise or consist essentially of $TiO_x$ or $Si_3N_4$.

The coating 200, and other coatings disclosed herein are suitably applied to any transparent, substantially transparent, or light transmissive substrate such as substrate 100. The substrate is suitable for use in a variety of arrangements and settings where control of reflectance and transmittance of electromagnetic radiation is required or desired. Thus, in some embodiments, a coated substrate as disclosed herein may be a window, a protective covering (such as for a digital or other luminous or backlit display) or a skylight. In embodiments, the coated substrates are useful and are selectively arranged in terms of one or more of coating composition, layer composition, layer placement, layer thickness, and the like to obtain optimal control of reflectance and transmittance of electromagnetic radiation.

In embodiments, a coated substrate of the invention may be employed as a window pane. In such embodiments, the coated substrate may be arranged within an insulating glass ("IG") unit. IG units include at least two window panes situated substantially parallel to each other, with supporting infrastructure to provide a substantially enclosed or sealed space between the window panes. Such enclosed or sealed space is often substantially filled with no air (vacuum), air, an inert gas such as Argon, or a mixture of air and one or more inert gases. In such embodiments, one or both of the window panes of an IG unit may comprise any of the coatings disclosed herein on one or both major surfaces thereof. In some embodiments, any of the coatings disclosed herein may be applied on the first major surface of a first glass substrate, and the first major surface of first glass substrate may be arranged to contact the enclosed or sealed space between the window panes of an IG unit. The IG unit may further include at least a second glass substrate that does not include a coating of the invention. Other suitable arrangements are easily envisioned by those of skill. For example, the first and second window panes in IG units may suitably include one or more coatings of the invention as described herein, and/or one or more additional coatings applied for some other purpose such as antireflectivity, NIR reflectivity, privacy, scratch resistance, and the like.

In embodiments, an IG unit may include at least two substrates, such as any of the substrates disclose herein. Each of the substrates may include one or more major surfaces, which may be substantially parallel to each other. In embodiments, the IG unit may include a substrate mounting unit (e.g., window frame, window sash, spacers, seals, etc.), containing the at least two substrates therein. The substrate mounting unit may hold the two substrates in a substantially parallel configuration. The substrate mounting unit and at least two substrates may collectively form an enclosed space therebetween.

Figure 2:
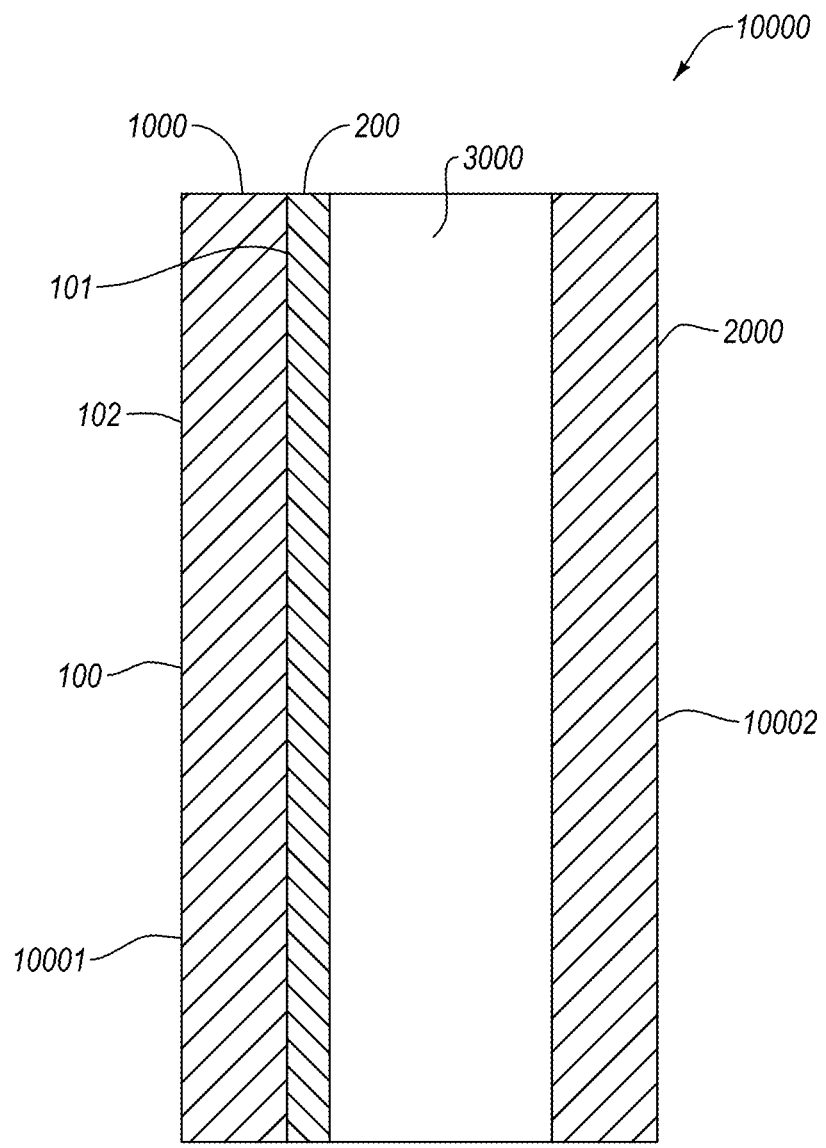
FIG. 2 is a schematic illustration of an insulated glass (IG) unit, according to an embodiment.

FIG. 2 is a schematic diagram showing an IG unit configuration according to an embodiment. IG unit 10000 includes first exterior surface 10001 and second exterior surface 10002, coated substrate 1000, and additional substrate 2000, wherein surfaces 10001 and 10002 may be situated substantially parallel to each other. Substrates 1000, 2000 may partially define enclosed space 3000. Additional infrastructure to define the enclosed space 3000 is arranged around IG unit 10000 in conventional fashion such as in a substrate mounting unit. Enclosed space 3000 may comprise substantially no air (vacuum), air, an inert gas, or a mixture of air and one or more inert gases. Coated substrate 1000 may include coating 200 on substrate 100 first surface 101, such that coating 200 contacts enclosed space 3000. In embodiments, light traveling from the surface 10001 to the surface 10002 (e.g., from outside a building to inside a building) may encounter a base layer (e.g., lowermost layer adjacent to the substrate) of the coating 200 first. In embodiments, the coating may be disposed on the additional substrate 2000 such that light traveling from the surface 10001 to the surface 10002 may encounter a top layer (e.g., uppermost layer) of the coating 200 first.

The coatings disclosed herein may be disposed on a substrate using any suitable thin film deposition methods known to those of skill. In embodiments, a sputtering technique may be employed to deposit, dispose, or apply one or more layers of a coating stack. In such embodiments, sputtering may be employed to deposit, dispose, or apply each of the 6 to 20 layers of the coating stack. Sputtering is a technique used to deposit thin films of a material onto a surface or substrate. By first creating a gaseous plasma and then accelerating the ions from this plasma into a source material, the source material is eroded by the arriving ions via energy transfer and is ejected in the form of neutral particles as either individual atoms or clusters of atoms or molecules. As these neutral particles are ejected they travel in a straight line unless they come into contact with something, whether it is another particle or a nearby surface. A substrate as described herein, placed in the path of these ejected particles will be coated by a layer thereof. Gaseous plasma is a dynamic condition where neutral gas atoms, ions, electrons and photons exist in near balanced state simultaneously. One can create this dynamic condition by metering a gas, such as argon or oxygen into a pre-pumped vacuum chamber and allowing the chamber pressure to reach a specific level and then introducing a live electrode into this low pressure gas environment using a vacuum feed through. An energy source, such as RF, AC, or DC may be used to feed and thus maintain the plasma state as the plasma loses energy into its surroundings. In embodiments, the type of sputtering used may be diode sputtering, magnetron sputtering, confocal sputtering, direct sputtering or other suitable techniques.

In embodiments, sputtering may be carried out in a batchwise, semi-continuous, or continuous process. Semi-continuous and continuous processes involve conveying the light-transmissive substrate through a series of two or more zones or chambers wherein layers are applied sequentially during the conveying. Where the substrate is e.g. a plate or sheet of glass, such processes are semi-continuous; where the substrate is e.g. a roll of polyester film such processes are continuous. In both semi-continuous and continuous processes, the rate of conveyance of a substrate through the apparatus can be adjusted by the operator to vary layer or coating thickness, which provides an additional variable for production in addition to varying the power applied to the targets during the sputtering. In batchwise processes, the operator can adjust layer thickness by varying power applied to targets or dwell time in a zone or chamber.

Reflective layers, alloy layers, and barrier layers may be suitably sputtered from the corresponding metallic sources within a substantially inert atmosphere. Oxide layers and in some embodiments functional top layers may be suitably sputtered from a corresponding dielectric source or by sputtering a metal target in a reactive atmosphere. For example, to deposit zinc oxide, a zinc target can be sputtered in an oxidizing atmosphere, or to deposit a silicon nitride layer, a silicon target can be sputtered in a nitrogen atmosphere. Thus in embodiments, one or more oxide or nitride layers of one or more coating layer stacks may be applied by sputtering from the corresponding oxide source or by sputtering a metal target in a reactive atmosphere. Top layers suitably include metal, metal oxide, or metal nitride and the corresponding source is employed consistent with the intended layer composition.

In embodiments, chemical vapor deposition (CVD) may be used to dispose one or more layers of a coating on a substrate. CVD involves the decomposition of gaseous sources via a plasma and subsequent layer deposition onto the substrate. Deposition zones may be suitably arranged similarly to a magnetron sputtering system, such that the layer thickness disposed on the substrate may be adjusted by varying the speed of the substrate as it passes through the one or more plasma zones, and/or by varying the power and/or gas flow rate within each of the one or more plasma zones.

The coated substrates disclosed herein provide advantages over currently available NIR reflective substrates, particularly substrates coated with conventional triple silver coatings. The coatings disclosed herein offers the advantages associated with triple silver coatings such as favorable solar heat gain/visible light ratios. The coated substrates disclosed herein have the color, transparency, and other visible advantages associated with the use of alloy and superalloy coatings in conjunction with triple silver coatings, while exhibiting reduced blue/green color shift at one or more acute angles from the normal viewing surface of a light transmissive coated substrate compared to conventional triple silver coatings. The coated substrates disclosed herein are readily manufactured using techniques that allow for ease of control of layer thicknesses which in turn allows control over acute angle viewing properties.

The coatings disclosed herein reduce color inconsistency when viewed normal to the glass surface vs. at acute angles. The color coordinate values of the coated article from a direction that is substantially normal to a coated major substrate surface (defined as 0°) may be substantially equal to the color coordinate values from directions that are acute to the coated major surface, such as at angles of about 10° to 89°, or about 15° to 89°, or about 20° to 89°, or about 25° to 89°, or about 30° to 89°, or about 35° to 89°, or about 40° to 89°, or about 45° to 89°, or about 50° to 89°, or about 55° to 89°, or about 60° to 89°, or about 65° to 89°, or about 70° to 89°, or about 75° to 89°, or about 80° to 89°, or about 85° to 89°, or about 10° to 85°, or about 10° to 80°, or about 10° to 75°, or about 10° to 70°, or about 10° to 65°, or about 10° to 60°, or about 15° to 85°, or about 15° to 80°, or about 15° to 75°, or any subrange thereof. In embodiments, the variation in color coordinate values of the article from a direction that is substantially normal to the coated major surface to the color coordinate values from directions that are acute to the coated major surface may be reduced relative to known coated articles. To this end, the coatings disclosed herein appeal to a wide range of designs and building applications.

The coated substrates disclosed herein are transmissive to visible light, and may be opaque or substantially opaque to infrared radiation. The coatings disclosed herein may provide a visible light transmission in the range of about 20% to about 60%. Furthermore, the coatings may provide a Light to Solar Gain Ratio (LSG) (visible Light Transmittance divided by the Solar Heat Gain Coefficient) of approximately 1.7 to 2.3, or about 1.8 to 2.3, or about 1.9 to 2.3, or about 2.0 to 2.3, or about 2.1 to 2.3, or about 1.9 to 2.2, or about 1.9 to 2.1, or about 1.9 to 2.0. An IG unit including a coated substrate of the invention has an improved solar heat gain coefficient (SHGC) relative to both the conventional double and triple silver coated IG units, while maintaining a desirable visual light transmittance (~50% or greater), and further includes improved acute angle viewing properties as described above.

Working Example

A glass sheet (0.25″ thick clear standard window glass) was coated by applying twelve discrete layers by magnetron sputtering. The layers were applied in the order and at the layer thickness shown in Table 1. Layer 1 was deposited directly on the glass sheet with each of the subsequent layers disposed thereon in the order listed.

TABLE 1

Layers applied and thickness of each layer.

| Layer No. | Layer composition | Layer thickness, Å |
|---|---|---|
| 1 | ZnO and SnO$_2$ | 220 |
| 2 | Ag | 75 |
| 3 | Ti | 20 |

TABLE 1-continued

Layers applied and thickness of each layer.

| Layer No. | Layer composition | Layer thickness, Å |
|---|---|---|
| 4 | ZnO and SnO$_2$ | 780 |
| 5 | INCONEL ® 625 | 15 |
| 6 | AG | 110 |
| 7 | Ti | 20 |
| 8 | ZnO and SnO$_2$ | 580 |
| 9 | Ag | 130 |
| 10 | Ti | 20 |
| 11 | ZnO and SnO$_2$ | 140 |
| 12 | TiOx | 140 |

Two glass samples were coated in this manner. Additional triple-silver coated glass substrates were obtained from commercial sources in the open market (each having a different configuration than the coating of Table 1); these were assigned identification as Samples 2 and 4 as indicated in Table 2.

Each coated glass sheet was mounted in an IG unit, wherein each of the IG units was configured in the same way as the IG unit of FIG. 2. Specifically, the coated side of the coated glass sheets were situated with the coating contacting the substrate 1000 and the enclosed space defined by the IG unit. Thus each IG unit 10000 includes first exterior surface 10001; second exterior surface 10002; coated substrate 1000 which is e.g. the coated substrate of Table 1, a modified version thereof, or a commercially available triple-silver coated substrate; and an additional substrate 2000, wherein substrate surfaces 10001 and 10002 are situated substantially parallel to each other. Substrates 1000, 2000 partially define enclosed space 3000; additional infrastructure to define the enclosed space 3000 is arranged around IG unit 10000 in conventional fashion. Each coated substrate 1000 includes a coating on substrate 100 first surface 101, such that the coating contacts enclosed space 3000. The IG units were arranged such that the substrate 1000 is outermost in relation to an outer surface of the building (e.g., contacts the exterior environment of the building) in which the IG unit is mounted, making the substrate 2000 interior to the first substrate 1000 and building the IG unit is mounted on.

TABLE 2

Coated glass mounted in IG units for testing

| IG Sample | Coating |
|---|---|
| 1 | Coating of Table 1 |
| 2 | Commercially available triple silver coated soda glass (first source) |
| 3 | Coating of Table 1, but without INCONEL ® |
| 4 | Commercially available triple silver coated soda glass (second source) |
| 5 | Coating of Table 1 |

Figure 3:
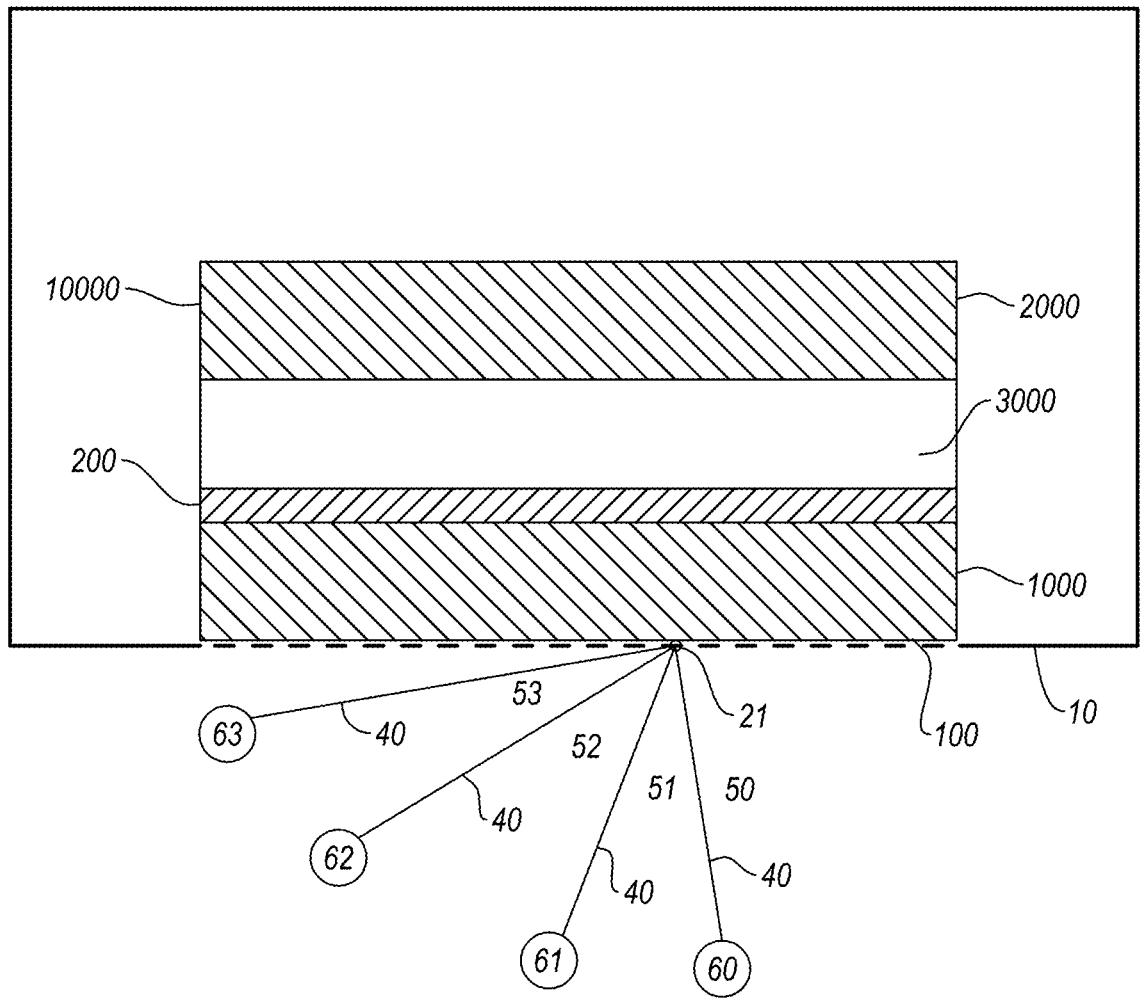
FIG. 3 is a schematic illustration of a test setup for visual evaluation of IG units having various coatings.

Each of the five IG samples (e.g., window units) were mounted side-by-side in a south-facing building window for testing purposes. The testing setup for a single IG sample, e.g. Sample 1, is shown in FIG. 3. Single-story building 10 is shown from the top. IG unit 10000 was mounted in opening 20 of building 10. The IG unit 10000 was configured the same as the IG unit of FIG. 2. The orientation of the IG unit 10000 in building 10 was such that additional substrate 2000 contacts the interior environment inside building 10.

Testing of the IG samples were conducted as follows. From a point 21 on the exterior of building 10 where the IG samples to be tested are mounted, distance 40 was measured from the exterior surface of building 10 at angles 50, 51, 52, and 53. Distance 40 is 12.2 meters (40 feet); angle 50 is 0° (normal); angle 51 is 30° from normal; angle 52 is 60° from normal; and angle 53 is 75° from normal. Thus position 60 is situated 12.2 meters from window opening 20 of building 10 and at angle 50 (0°) thereto. Position 61 is situated 12.2 meters from window opening 20 of building 10 and at angle 51 thereto. Position 62 is situated 12.2 meters from window opening 20 of building 10 and at angle 52 thereto. And position 63 is situated 12.2 meters from window opening 20 of building 10 and at angle 53 thereto.

Figure 4:
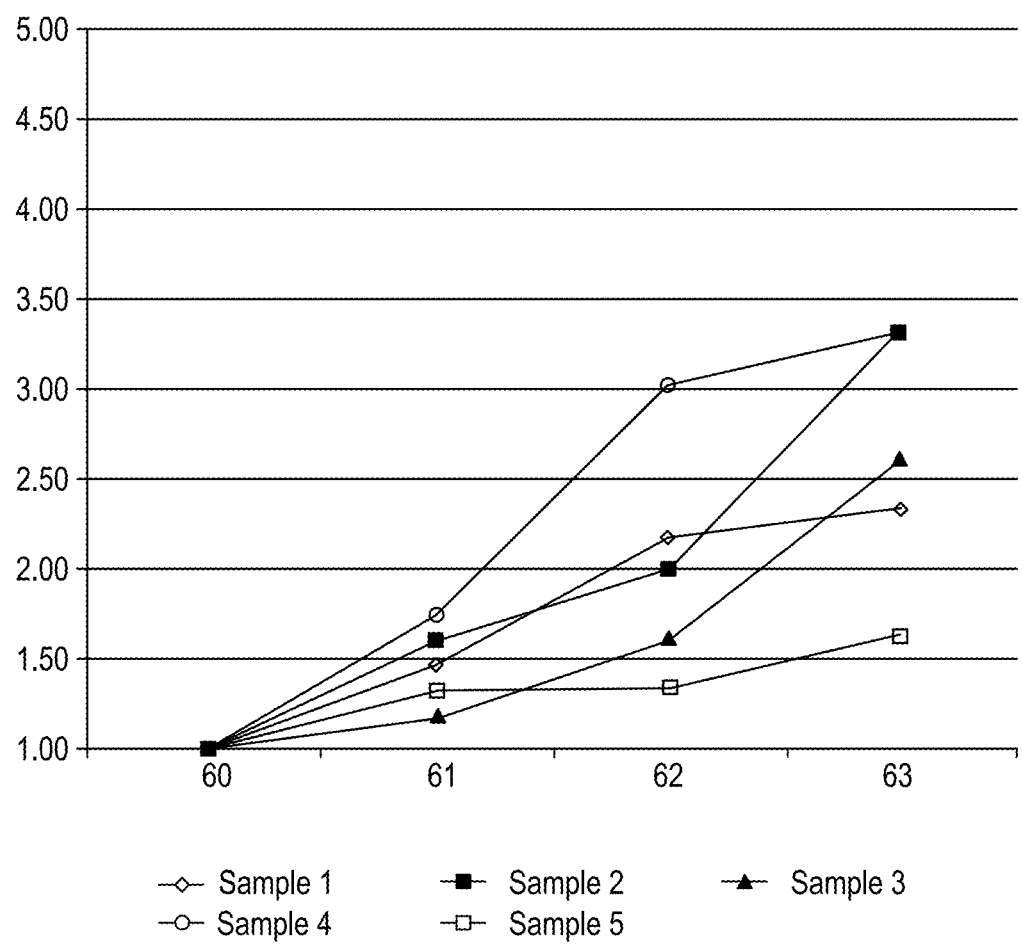
FIG. 4 is a plot showing viewer ratings of change in color of the IG units of as a function of position of the viewer.
Figure 5:
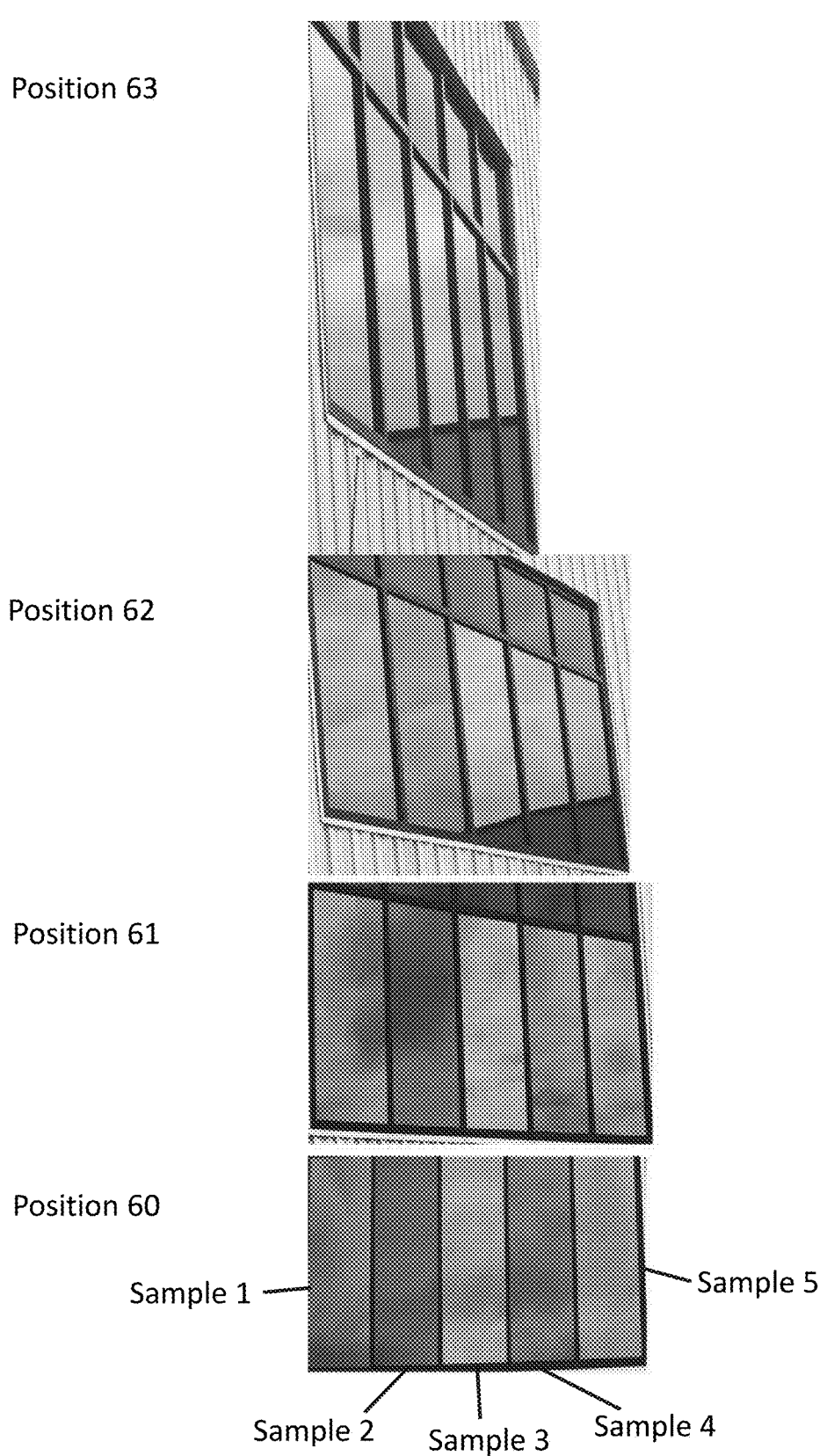
FIG. 5 is a series of photographs of Samples 1-5 recorded at the indicated positions.

Individuals participating in the test were unaware of the identity of any of IG samples 1-5. Each individual was instructed to stand at each position 60, 61, 62, 63 and observe the apparent color of Samples 1-5; each Sample at each position was then assigned a rating 1-5 based on apparent observed color shift: 1—little or no color shift; 2—slight color shift; 3—moderate color shift; 4—significant color shift; 5—maximum color shift. Color shift was evaluated relative to normal for each sample; that is, position 60 is the baseline against which comparison at each position 61, 62, 63 is made, wherein each comparison is made with a single sample evaluated at different angles. Results of seven individual evaluations are shown in Table 3 and depicted graphically in FIG. 4. FIG. 5 includes photos of the IG samples 1-5 at each of positions 60, 61, 62, 63 are shown in FIG. 5.

TABLE 3

Evaluations of IG samples for color shift as a function of position.

| Sample | Position | Rank, by individual Evaluator ||||||| Average |
| | | CB | AT | PA | AU | KS | ES | SS | |
| --- | --- | --- | --- | --- | --- | --- | --- | --- | --- |
| 1 | 60 | | | | | | | | 1.00 |
| | 61 | 2 | 1 | 1 | 1 | 1 | 3 | 1 | 1.43 |
| | 62 | 4 | 1 | 4 | 2 | 1 | 2 | 1 | 2.14 |
| | 63 | 5 | 1 | 5 | 2 | 1 | 1 | 1 | 2.29 |
| 2 | 60 | | | | | | | | 1.00 |
| | 61 | 1 | 1 | 1 | 2 | 4 | 1 | 1 | 1.57 |
| | 62 | 1 | 3 | 1 | 3 | 3 | 1 | 2 | 2.00 |
| | 63 | 4 | 4 | 3 | 4 | 2 | 3 | 3 | 3.29 |
| 3 | 60 | | | | | | | | 1.00 |
| | 61 | 1 | 1 | 1 | 1 | 2 | 1 | 1 | 1.14 |
| | 62 | 2 | 2 | 1 | 2 | 2 | 1 | 1 | 1.57 |
| | 63 | 5 | 3 | 1 | 3 | 3 | 1 | 2 | 2.57 |
| 4 | 60 | | | | | | | | 1.00 |
| | 61 | 1 | 1 | 1 | 1 | 3 | 2 | 3 | 1.71 |
| | 62 | 2 | 4 | 1 | 3 | 5 | 2 | 4 | 3.00 |
| | 63 | 5 | 4 | 2 | 3 | 5 | 1 | 3 | 3.29 |
| 5 | 60 | | | | | | | | 1.00 |
| | 61 | 1 | 1 | 1 | 1 | 1 | 2 | 2 | 1.29 |
| | 62 | 1 | 1 | 1 | 1 | 1 | 1 | 3 | 1.29 |
| | 63 | 2 | 1 | 1 | 2 | 1 | 1 | 3 | 1.57 |

As shown in table 3, IG samples 1 and 5, having the coating of table 1, showed the lowest average scores for perceived deviation of color at acute angles. IG sample 5 showed particularly low deviation scores. The commercially available coatings of IG samples 2 and 4 showed the highest average scores.

What is claimed is:

1. A coated substrate, comprising:
   a light transmissive substrate having one or more major surfaces; and
   a coating disposed on at least a portion of one major surface of the substrate, the coating comprising a plurality of discrete layers, including:
   a first reflective layer;
   a second reflective layer disposed above the first reflective layer;
   a third reflective layer disposed above the second reflective layer;
   a first oxide layer disposed between the first and second reflective layers;
   a second oxide layer disposed between the second and third reflective layers;
   a third oxide layer disposed between the substrate and the first reflective layer; and
   an alloy layer disposed between the first and second reflective layers and contiguous to the second reflective layer, wherein the alloy layer comprises at least about 58 weight % Ni, about 20 to about 23 weight % Cr, about 8 to about 10 weight % Mo, about 3.15 to about 4.15 weight % Nb+Ta, and less than about 5 weight % Fe;
   wherein the coating has a thickness of about 1000 Å to 4000 Å.

2. The coated substrate of claim 1 wherein the light transmissive substrate comprises a glass.

3. The coated substrate of claim 1 wherein the light transmissive substrate comprises a polymer, a polyacrylate, or a polycarbonate.

4. The coated substrate of claim 1 wherein the each of the first, second, and third reflective layers are about 50 Å to 200 Å thick and consist essentially of silver.

5. The coated substrate of claim 1 wherein the alloy layer is about 5 Å to 100 Å thick.

6. The coated substrate of claim 1 wherein the first oxide layer, the second oxide layer, or both are about 300 Å to 1000 Å thick and comprise ZnO, $SnO_2$, $SnO_x$, or a mixture thereof.

7. The coated substrate of claim 1 wherein the coating further comprises a fourth oxide layer disposed above the third reflective layer.

8. The coated substrate of claim 1 wherein the coating further comprises one or more of a first barrier layer disposed above and contiguous to the first reflective layer, a second barrier layer disposed above and contiguous to the second reflective layer, or a third barrier layer disposed above and contiguous to the third reflective layer.

9. The coated substrate of claim 8 wherein the one or more of the first, second, or third barrier layers are each about 10 Å to 50 Å thick and comprise titanium.

10. The coated substrate of claim 1 wherein the coating further comprises a functional top layer.

11. The coated substrate of claim 10 wherein the functional top layer is about 50 Å to 300 Å thick and comprises one or more metals, metal oxides, metal nitrides, metals having partial oxidation states, or a mixture thereof.

12. An insulated glass unit, comprising:
   at least two light transmissive substrates each having one or more major surfaces;
   a substrate mounting unit containing the at least two substrates, wherein the substrate mounting unit holds the at least two substrates in a substantially parallel configuration, and the substrate mounting unit and at least two substrates collectively form an enclosed space;
   a coating disposed on at least a portion of at least one of the major surfaces, the coating comprising a plurality of discrete layers, including:
   a first reflective layer;
   a second reflective layer disposed above first reflective layer;
   a third reflective layer disposed above second reflective layer;
   a first oxide layer disposed between first and second reflective layers;
   a second oxide layer disposed between second and third reflective layers;
   a third oxide layer disposed between the substrate and the first reflective layer; and
   an alloy layer disposed between first and second reflective layers and contiguous to the second reflective layer, wherein the alloy layer comprises at least about 58 weight % Ni, about 20 to about 23 weight % Cr, about 8 to about 10 weight % Mo, about 3.15 to about 4.15 weight % Nb+Ta, and less than about 5 weight % Fe;
   wherein the coating has a thickness of about 1000 Å to 4000 Å.

13. The insulated glass unit of claim 12 wherein the coating is disposed within the enclosed space.

14. The insulated glass unit of claim 13 wherein the coating is disposed on an outermost substrate of the at least two substrates.

15. The insulated glass unit of claim 13 wherein the coating is disposed on an innermost substrate of the at least two substrates.

* * * * *